United States Patent
Hébert

(10) Patent No.: US 8,193,583 B2
(45) Date of Patent: Jun. 5, 2012

(54) MONOLITHIC OUTPUT STAGE WITH VERTICAL HIGH-SIDE PMOS AND VERTICAL LOW-SIDE NMOS INTERCONNECTED USING BURIED METAL, STRUCTURE AND METHOD

(75) Inventor: François Hébert, San Mateo, CA (US)

(73) Assignee: Intersil Americas, Inc., Milpitas, CA (US)

( * ) Notice: Subject to any disclaimer, the term of this patent is extended or adjusted under 35 U.S.C. 154(b) by 284 days.

(21) Appl. No.: 12/717,976

(22) Filed: Mar. 5, 2010

(65) Prior Publication Data

US 2010/0276752 A1 Nov. 4, 2010

Related U.S. Application Data

(60) Provisional application No. 61/295,270, filed on Jan. 15, 2010.

(51) Int. Cl.
*H01L 27/092* (2006.01)
*H01L 21/8238* (2006.01)
*H01L 21/336* (2006.01)

(52) U.S. Cl. .......... 257/338; 257/E21.41; 257/E21.638; 257/E27.062; 257/E29.262; 438/212

(58) Field of Classification Search .................. 257/338, 257/E21.632, E21.41, E27.062, E29.262; 438/212
See application file for complete search history.

(56) References Cited

U.S. PATENT DOCUMENTS
5,643,821 A 7/1997 Beasom
5,939,755 A * 8/1999 Takeuchi et al. .............. 257/347

OTHER PUBLICATIONS

Robb et al., "High Temperature Lateral Dopant Diffusion in WSi2, TiSi2 and TiN Films", Proceedings of the Second International Symposium on Semiconductor Wafer Bonding: Science, Technology and Applications ECS proceedings, vol. 93-29, pp. 230-239.
Bain et al., "SiGe HBT's on Bonded SOI Incorporating Buried Silicide Layers", IEEE Transactions on Electron Devices, vol, 52, No. 3, Mar. 2005, pp. 317-322.
Goh et al., "Buried Metallic Layers with Silicon Direct Bonding", ECS, vol. 95-1, Spring Meeting abstract No. 407, pp. 623-624.
Hebert, "Co-Packaging Approach for Power Converters Based on Planar Devices, Structure and Method", U.S. Appl. No. 12/470,229, filed May 21, 2009.
Hebert, "Single Die Output Power Stage Using Trench-Gate Low-Side and LDMOS High-Side MOSFETS, Structure and Method", U.S. Appl. No. 12/471,911, filed May 26, 2009.
Bell et al., "Stacked Power Converter Structure and Method", U.S. Appl. No. 12/477,818, filed Jun. 3, 2009.
Gaul, "Series/Parallel Power Supply Switching", U.S. Appl. No. 61/256,145, filed Nov. 24, 2009.

* cited by examiner

*Primary Examiner* — David S Blum
(74) *Attorney, Agent, or Firm* — Fogg & Powers LLC

(57) ABSTRACT

A voltage converter can include an output circuit having a vertical high-side device and a vertical low-side device which can be formed on a single die (i.e. a "PowerDie"). The high side device can be a PMOS transistor, while the low side device can be an NMOS transistor. The source of the PMOS transistor and the source of the NMOS transistor can be formed from the same metal structure, with the source of the high side device electrically connected to $V_{IN}$ and the source of the low side device electrically connected to ground. A drain of the high side PMOS transistor can be electrically shorted to the drain of the low side NMOS transistor during device operation using a metal layer which is interposed between the transistors and a semiconductor substrate.

24 Claims, 11 Drawing Sheets

MONOLITHIC OUTPUT STAGE WITH VERTICAL HIGH-SIDE PMOS AND VERTICAL LOW-SIDE NMOS INTERCONNECTED USING BURIED METAL, STRUCTURE AND METHOD

This application claims priority to U.S. Provisional Patent Ser. No. 61/295,270 filed Jan. 15, 2010.

DESCRIPTION OF THE INVENTION

This invention relates to the field of semiconductor devices and, more particularly, to power conversion and control structures and their methods of formation.

Semiconductor devices that provide power converter functionality, for example for altering DC power using a DC to DC (DC-DC) converter, are used in various capacities. For example, input DC power from one or more batteries can be converted to provide one or more power outputs at voltages that can be higher or lower than the input DC voltage. Performing a power conversion function using integrated circuits (IC's) typically requires a DC high-side transistor electrically coupled with voltage in ($V_{IN}$), a DC low-side transistor electrically coupled with ground, and a control circuit. In a synchronous step-down device (i.e. a synchronous buck, or "synch buck" converter), for example, power conversion is performed to decrease voltage by alternately enabling the high-side device and the low-side device, with a switching and control function being performed by the controller circuit with high efficiency and low power loss through the device.

Power converter circuits which can operate at a high power density (for example, high voltage and high current, in a small space) are needed, particularly devices which can efficiently convert power at a reasonable cost while minimizing space required for the device on a printed circuit board or other receiving substrate. One challenge with high power density is that the size of the output circuitry increases as the voltage and current rating of the converter increases because power transistors require larger spacing in order to operate at high-voltages. Different implementations of the controller circuit, the high-side device, and the low-side device have been used, each with its own advantages and disadvantages.

As depicted in FIG. 1, co-packaged devices 10 can include control circuitry on one semiconductor die 12 to provide a controller IC, the high-side device on a second die 14, and the low-side device on a third die 16. A representative circuit schematic of the FIG. 1 device is depicted in FIG. 2, which also depicts controller circuitry 12, high-side MOSFET 14 connected to a $V_{IN}$ pinout and adapted to be electrically coupled with $V_{IN}$ during device operation, and low-side MOSFET 16 connected to a power ground ($P_{GND}$) pinout and adapted to be electrically coupled with $P_{GND}$ during device operation. The devices can have standard package pinouts and pin assignments such as those depicted. Forming controller, low-side, and high-side devices on separate dies can have problems with interconnection parasitics on the controller IC which can negatively influence device performance. This may result from parasitic inductance inherent in bond wires, electromagnetic interference (EMI), ringing, efficiency loss, etc. Higher-quality connections such as copper plate (or clip) bonding, or ribbon bonding, can be used to reduce parasitics, but this increases assembly costs. Further, co-packaging standard vertical MOSFETs can result in a circuit with parasitic inductance in series with the output node. Problems caused by parasitic inductances are well established in the art. While a capacitor can be connected to the output terminals such as the input ($V_{IN}$) and ground to compensate for the negative impact of inductances connected to these nodes, internal parasitic inductances cannot be compensated by this technique since the internal nodes are not available at external package locations.

Additionally, packages containing three separate dies have higher production costs, for example because of the large number of die attach steps (three dies in this example), and additional space is required for spacing between adjacent dies to allow for die attach fillets, die placement tolerance, and die rotation tolerance, which reduces the power-density which can be achieved. To reduce electrical interference between adjacent dies and to realize the desired device interconnection, each die is placed on a separate die pad.

Examples of co-packaged devices include non-synch buck with co-packaged high-side MOSFET and external Schottky diode, non-synch buck with co-packaged high-side and low-side MOSFETs, synchronous buck with co-packaged high-side and low-side MOSFETs, boost converter with co-packaged MOSFETs (synchronous boost), and boost converter with co-packaged MOSFET and Schottky diodes.

Discrete devices can also be mounted separately to a printed circuit board. In this solution, a first packaged die containing controller circuitry is used in conjunction with a second packaged die containing a high-side MOSFET and a third package containing a low-side MOSFET. The three packages are mounted on a printed circuit board. However, this can increase packaging costs as the number of dies and separate packages which must be manufactured and handled is at least tripled, and the area used on the printed circuit board is also increased, leading to increased circuit board size.

Power converters exist which use N-channel MOSFETs for both high side and low side applications. This requires the use of complex designs for the controller and/or gate driver integrated circuits.

There is a need for power converters in which device processing costs and device footprint are reduced while providing a power converter device which has sufficient device electrical characteristics with low parasitic inductance and capacitance.

The accompanying drawings, which are incorporated in and constitute a part of this specification, illustrate embodiments of the invention and together with the description, serve to explain the principles of the invention. In the figures.

Figure 1:
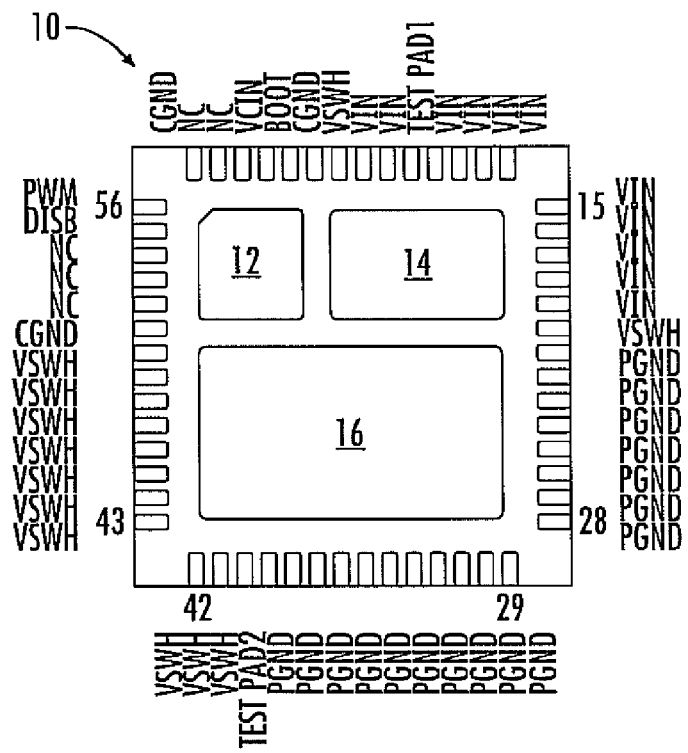
FIG. 1 is a bottom view of a conventional power converter device.
Figure 2:
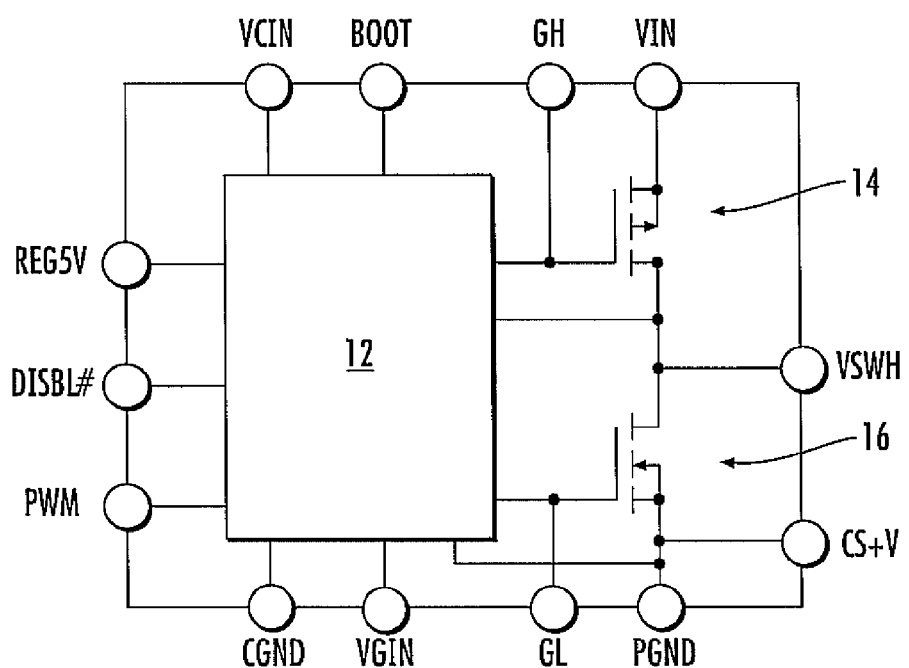
FIG. 2 is a schematic of a voltage converter device including output power devices, with a controller circuit, a high side device connected to $V_{IN}$, and a low side device connected to ground all being formed on separate semiconductor dies.

It should be noted that some details of the FIGS. have been simplified and are drawn to facilitate understanding of the inventive embodiments rather than to maintain strict structural accuracy, detail, and scale.

Reference will now be made in detail to the present embodiments (exemplary embodiments) of the invention, examples of which are illustrated in the accompanying drawings. Wherever possible, the same reference numbers will be used throughout the drawings to refer to the same or like parts.

DC to DC power converters based on a high side lateral PMOS and low side lateral NMOS can be used in low-voltage monolithic (single die, using lateral devices interconnected on the top surface of the monolithic die) implementations as well as discrete implementations. The use of a lateral PMOS high side device simplifies the controller design. One drawback, however, is a relatively high specific resistance ($RDS_{ON}$*Area) of lateral PMOS devices, which is typically two to three times higher than that of a lateral NMOS device with equivalent geometry. This can result because of a much lower mobility of holes (carrier in PMOS) compared to electrons (carrier in NMOS). Discrete implementations, for example using efficient trench double-diffused metal oxide semiconductor (DMOS) PMOS devices, can suffer from parasitic inductance, large size, and a higher cost resulting from the need for multiple packages. Further, monolithic implementations are expensive, as the current rating and voltage rate increases, particularly because of the large size of high voltage, low resistance lateral PMOS devices. Co-packaging of a controller IC with a PMOS high side die and an NMOS low side die has been attempted, but this can be expensive due to the requirement to assemble multiple components and additional space (i.e. alignment and placement between the different dies). Thus, more efficient power stage configurations based on PMOS high side and NMOS low side devices would be desirable Various embodiments of the present teachings can include one or more features. For example: 1) monolithic (single die) integration of a high side vertical PMOS device with a low side vertical NMOS device; 2) a substrate used as the output (i.e. phase node) for both devices; 3) a top metal overlying the high side PMOS device is voltage in (i.e. $V_{IN}$, the PMOS source); 4) a top metal over the low side NMOS device, which can be formed as a single layer with the PMOS source metal, is the device ground (i.e. the NMOS source); 5) a power converter structure which can be formed using efficient devices such as enhancement mode devices, vertical DMOS devices, trench DMOS devices, or a combination of devices; 6) a power converter device which is compatible with high performance LDMOS devices; 7) a device wherein interconnection of the drain of the high side PMOS device (which is P-type) to the drain of the low side NMOS device (which is N-type) can achieved through a buried metal connection at the substrate-to-epitaxial layer interface; 8) one or more vertical DMOS and/or enhancement mode devices used for both NMOS and PMOS with planar gates; 9) a vertical trench gate structure used for both the NMOS and PMOS devices; 10) a buried metal short between the PMOS drain, the NMOS drain, and the conductive substrate; 11) transition or buffer layers doped with slow diffusing dopants such as antimony and arsenic can be used between a highly doped substrate and a buried conductor so as to minimize counter doping, and; 12) patterned or partial buried layer and a buried conductor.

A first method to form a structure according to an embodiment of the present teachings is depicted in FIGS. 3-16. As will be understood from the description below, this method can use as few as 9 layers, including: 1) a buried layer (BL) mask; 2) a PMOS drain mask; 3) a trench mask; 4) an N-body mask (i.e. a mask for implantation of the body of the PMOS device); 5) a P-body mask (i.e. a mask for implantation of the body of the NMOS device); 6) an N+ implant mask; 7) a P+ implant mask; 8) a contact opening etch mask, and; 9) a metal etch mask. The method can optionally include a bond pad etch mask.

Figure 3:
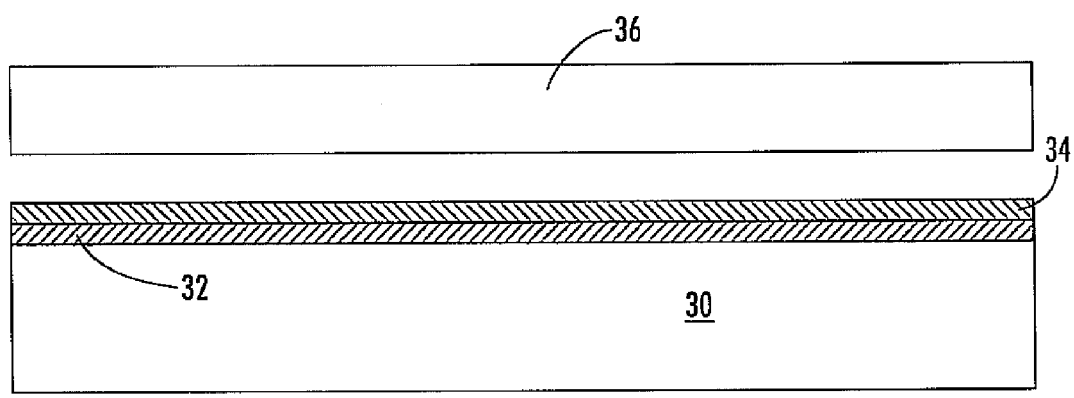
FIGS. 3-16 are cross sections depicting various in-process structures formed in accordance with an embodiment of the present teachings.
Figure 4:
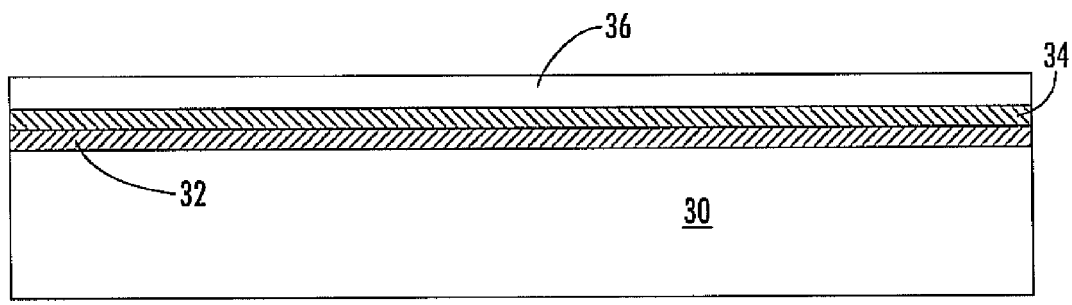
Figure 5:
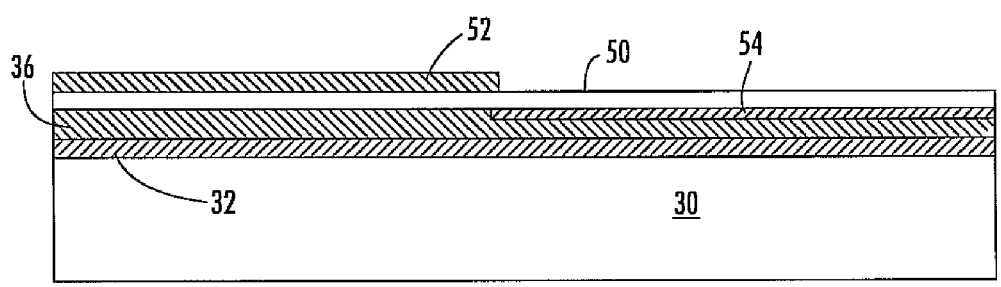
Figure 6:
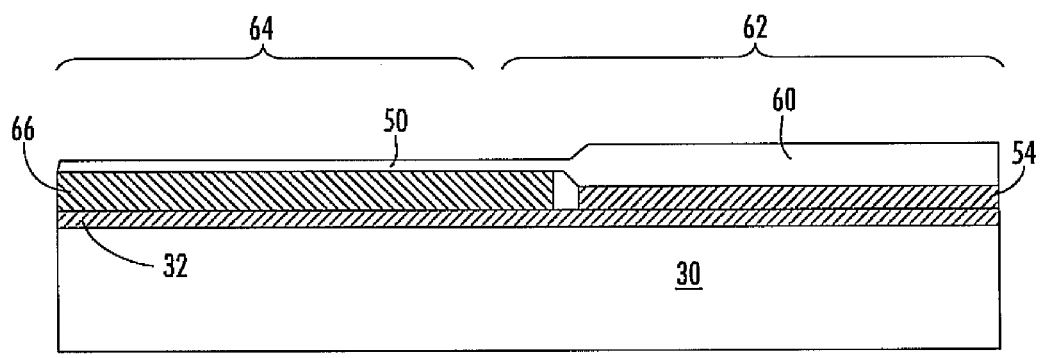

As depicted in FIG. 3, a substrate wafer 30 (i.e. handle wafer) which highly doped to an N-type conductivity (i.e. "N+++") can receive a conductor layer 32 such as a deposition of tungsten (W) or tungsten silicide ($WSi_x$) to a thickness of between about 0.1 microns (μm) to about 1.0 μm. Subsequently, polysilicon 34 is deposited on the conductor layer to a thickness of between about 0.1 μm to about 4.0 μm then planarized, for example using chemical mechanical polishing (CMP) to achieve a flat smooth surface. A separate device wafer 36 is bonded to the polished polysilicon surface of the substrate wafer, for example using commercially available wafer bonders such as those from EVG of Tempe, Ariz. and Karl Suss of Waterbury Center, Vt. After the device wafer is bonded to the handle wafer with the buried metal, the device wafer can be ground, polished, or planarized to a thickness of between about 0.2 μm to about 3.0 μm to result in a structure similar to that depicted in FIG. 4.

Next, a pad oxide 50 in the range of between about 100 Å to about 300 Å and a nitride 52 in the range of about 500 Å to about 1,500 Å are deposited on the device wafer. A patterned mask (not depicted) is formed over the nitride 52, the nitride is etched, and an N+ buried layer 54 is implanted either before or after removal of the patterned mask. The N+ buried regions 54 can be implanted using antimony or arsenic, with doses in the range of between about $1E13$ atoms/cm$^2$ to about $5E15$ atoms/cm$^2$ and energies in the range of about 20 KeV to about 140 KeV. Once the mask is removed, a structure similar to that of FIG. 5 remains, including an N+ doped layer 54 implanted into the right side (as depicted) of the device wafer 36.

With the nitride 52 and pad oxide 50 in place, an oxidation is performed which consumes a portion of device wafer and thickens the oxide on the exposed right side of the wafer to result in a thick oxide 60 on the right side (as depicted) of the device wafer 36. This results in a slight step as depicted between the NMOS region 62 and the PMOS region 64, equivalent to approximately half of the thickness of the oxide grown, which can be used as alignment for subsequent processing. The oxidation step can also be performed at a temperature sufficient to diffuse the N+ buried layer 54 into the device wafer as depicted. The nitride is stripped and a P+ buried layer implant 66, for example using boron or $BF_2$, a dose in the range of between about $1E13$ atoms/cm$^2$ to about $5E15$ atoms/cm$^2$, and an energy in the range of between about 10 KeV and about 80 KeV can be is performed in a self-aligned fashion, since the oxide 60 grown over the N+ regions 62 will block this P implant. The P+ implant can be followed by an optional P+ buried layer anneal, which may be a rapid thermal processing (RTP) step and/or a diffusion to result in a structure similar to that depicted in FIG. 6.

Subsequently, the oxide is etched and the wafers are cleaned and an N-type epitaxial layer (N-epi) 70 is deposited on the top surface of the device wafer. The thickness and doping concentration of this epitaxial silicon region depend on the requirements of a subsequently-formed N-channel Vertical DMOS transistor. For a device rated at about 30V, the N-epi may have a thickness in the 3 to 6 micron range, and a doping concentration in the range of between about $2.0E16$ atoms/cm$^3$ to about $2.6E16$ atoms/cm$^3$. It should be noted that the small step disparity between the N and P regions is neglected in the following description and FIGS., since it is a fraction of the thickness of the silicon grown and since it is outside of the active area of devices.

A pad oxide (not depicted) is formed on the epitaxial layer 70 and a patterned mask (preferably thick resist, in the 2 to 5 micron range for example, not depicted) is applied to enable the doping of the PMOS drain region, resulting in P-type portion 72 of epitaxial layer 70, and an N-type portion 74 of epitaxial layer 70. During the P-type implant, the mask protects N-type epitaxial layer portion 74 from implantation of P-type dopants using a thick resist. The PMOS drain implant can be performed using multiple high-energy boron implants, for example using a boron implant with energies in the ranges of about 100-200 KeV, about 300-450 KeV and about 800-1500 KeV, and doses in the range of between about 1 E11 atoms/cm$^2$ to about 1 E13 atoms/cm$^2$, for a PMOS drain formation based on three separate implants. The resist is removed, and a PMOS drain region anneal can performed to result in the FIG. 7 structure. The drain region anneal may be performed in a furnace, with temperature in the range of between about 900° C. to about 1200° C., depending on the desired PMOS drain doping profile. It should be noted that the NMOS drain 74 can also be formed by implant and diffusion, similar to that of the formation of the drain of the PMOS device, with any required process modifications.

It is known that the diffusion coefficients of silicon dopants including boron, arsenic and antimony are many orders of magnitude higher in tungsten silicide than they are in silicon. Layer 32 below the buried layers, if tungsten is used, may be at least partially converted to tungsten silicide during bonding and other high temperature steps.

As a result, the buried layer dopants may almost instantly diffuse laterally from one device region (e.g. 64) to the other (e.g. 62) once they come in contact with the silicide. In the case of the fast (in silicon) diffusing boron, the laterally diffused dopant may then up diffuse into the opposite conductivity type island. If this occurs, this may result in dopant compensation that increases buried layer resistivity. Further, if diffusion time is high enough and buried layer thickness is small enough, it will out diffuse the slower moving N buried layer to form a net P layer that separates the N buried layer from the N drain region. Options to mitigate these problems include using lower doping level for the P buried layer than for the N buried layer and using P for the N buried layer. The P diffusion coefficient is about equal to that of boron so the boron cannot easily out diffuse it. Using N and P type buried layer dopants with about the same diffusion coefficient may also result in similar up diffusion distance into the overlying epitaxial layer for both. That results in similar buried layer to body distance for both type devices as required for minimum on resistance at the same breakdown voltage for the two devices.

The diffusion of dopants within and out of the buried metal can be controlled by altering the types of dopants used, the dopant concentration, and the processing time and temperature. In addition, the diffusion of dopants may be altered by changing the composition of the buried metal. Compositions can include, for example, silicon-rich tungsten silicide (WSi$_x$, where x>2). Additionally, diffusion is dependent on the crystalline structure of the buried metal, for example, whether nanocrystalline, microcrystalline, or polycrystalline. Another diffusion control method includes the use of thin "barrier layers" such as TaN, TiN, TiW, TiWN, inserted within the buried metal. The use of a thin layer will minimize series resistance.

Figure 7:
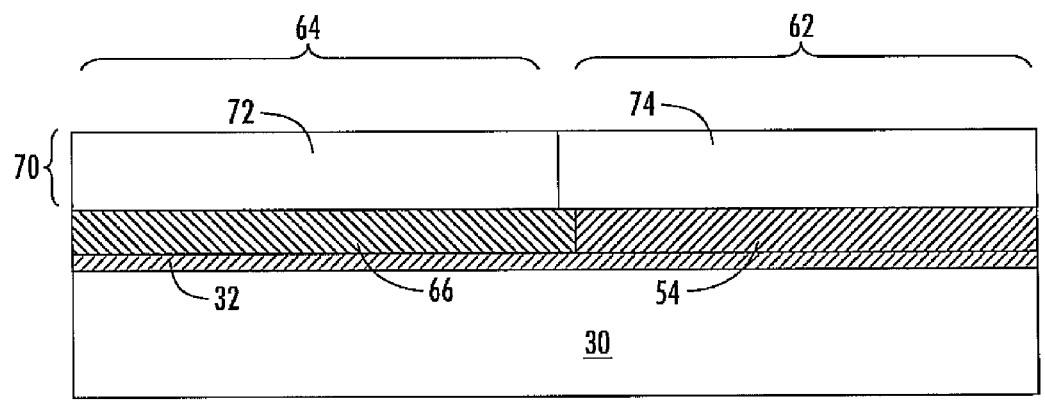

After forming a structure similar to FIG. 7, various processing can be performed, for example to form an optional masked active area oxidation, for example using a local oxidation of silicon (LOCOS) process at other wafer locations. A pad oxide is then formed, followed by a hard mask oxide, a trench mask 80, an oxide etch, and a silicon etch of the epitaxial layer 70 to form MOSFET gate trenches 82 which results in a structure similar to FIG. 8.

Figure 8:
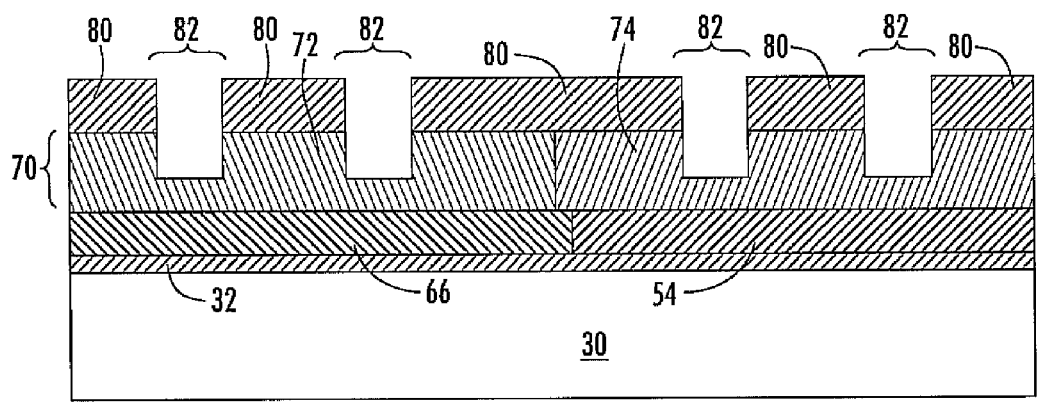
Figure 9:
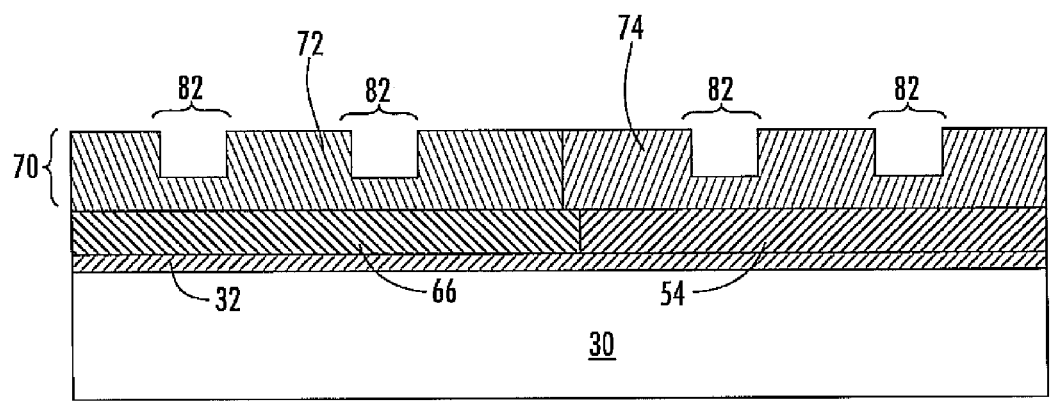

The FIG. 8 structure is cleaned to remove the mask 80 and expose the epitaxial layer 70 as depicted in FIG. 9, then an optional isotropic (round hole) etch can be performed, followed by removal of the hardmask to expose the silicon surface in the active regions. The wafer is cleaned, and a sacrificial oxide (sac ox) growth is performed in the active region using standard thermal oxidation. This sac ox is stripped off just prior to growing a high-quality gate oxide 100 over all exposed silicon surfaces in the active area (which includes the horizontal top surface, trench sidewall and trench bottom).

Figure 10:
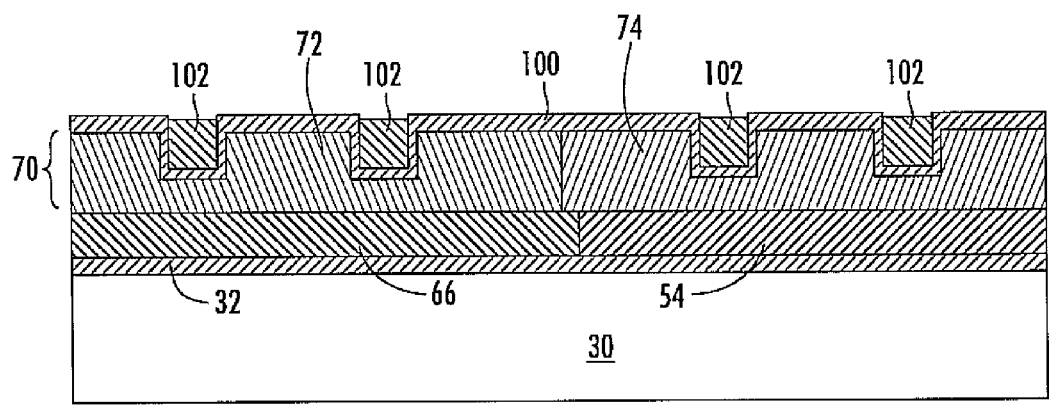

After growing gate oxide 100, a blanket polysilicon deposition is performed. This polysilicon can be undoped or can be selectively doped using ion implantation, for example using doped P+ polysilicon over the PMOS region and doped N+ polysilicon over the NMOS regions, using masks. A selective polysilicon etch back is performed to leave polysilicon 102 in the trenches, to remove the polysilicon from the upper surface of the epitaxial layer, and to leave the gate oxide 100 on the upper surface of the epitaxial layer 72 as depicted in FIG. 10. The etch back can be done using plasma etch techniques or CMP.

Figure 11:
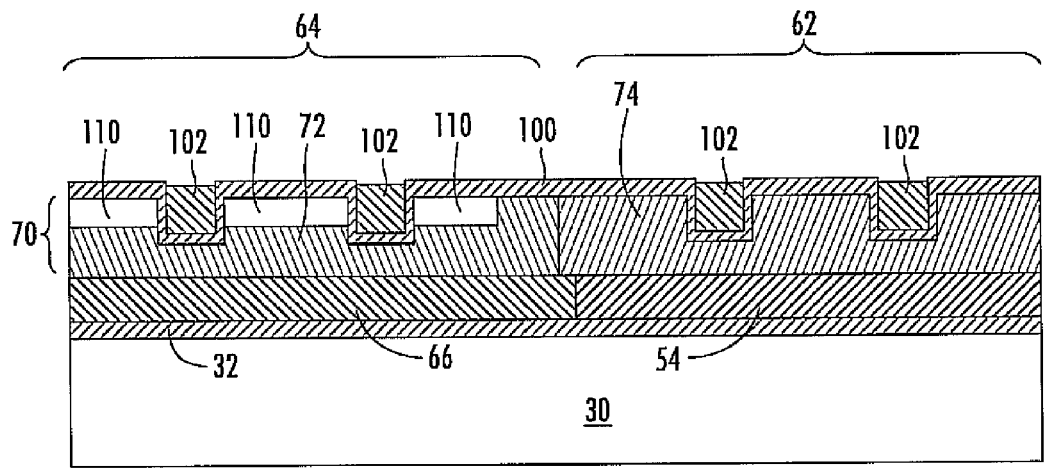

Subsequently, a patterned N-body mask (not depicted) is formed to expose a region of the PMOS device, an N-body implant of N-type dopants is performed, and an N-body anneal is performed to result in the FIG. 11 structure which forms an N-body 110 on the PMOS side 64 of the wafer as depicted.

Figure 12:
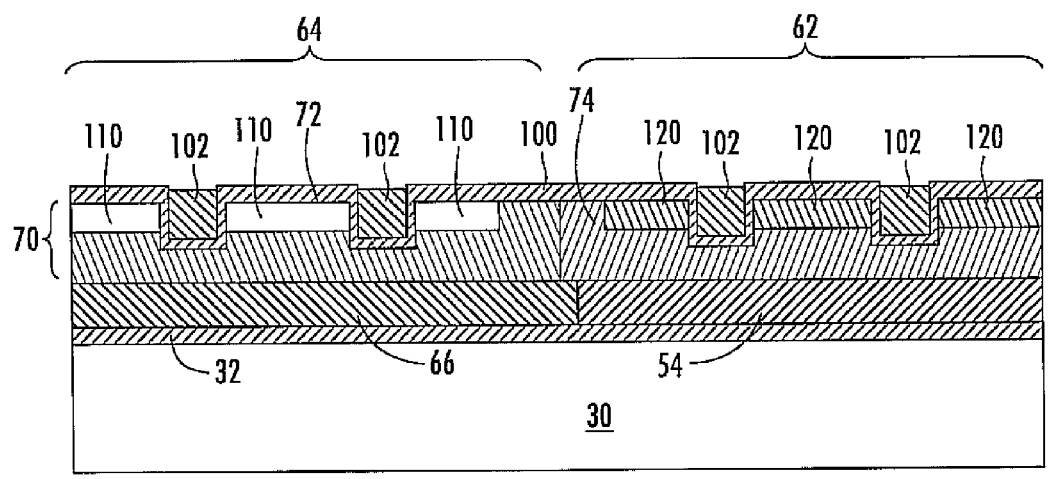

Next, a patterned P-body mask (not depicted) is formed to expose a portion of the NMOS region 62, a P-body implant of P-type dopants is performed, and a P-body anneal is performed to result in the FIG. 12 structure which forms a P-body 120 on the NMOS side 62 of the wafer as depicted.

Figure 13:
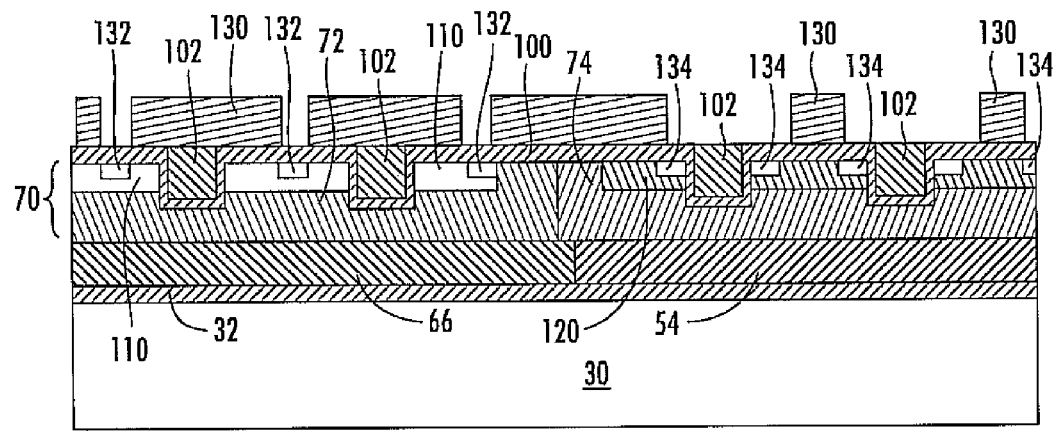

After forming a structure similar to FIG. 12, a mask 130 is formed over the structure as depicted in FIG. 13 which will be used to pattern various N+ regions. In this embodiment, this mask pattern defines PMOS body contacts 132 (i.e. contacts to the N-type body 110 of the PMOS device), defines the NMOS source 134, and provides NMOS doping into the polysilicon regions 102 on the NMOS side 62 of the structure, while the polysilicon on the PMOS side 64 of the structure is protected from the N-type implant by the mask 130. After forming the mask, an N+ implant is performed, for example to a dose in the range of between about 1E15 atoms/cm$^2$ to about 1E16 using an implant energy of about 70 KeV at 0° tilt. An N+ anneal is subsequently performed to result in the FIG. 13 structure.

It will be noted that the polysilicon 102 will form device gate electrodes. For low threshold (turn-on) voltage, it is preferred that the PMOS gates in PMOS region 64 are doped to a net P+ conductivity while the NMOS gates in NMOS region 62 are doped to a net N+ conductivity. In the process depicted, N+ dopants are therefore implanted into the NMOS gates, while the P+ material is implanted the PMOS gates. However, in an alternate process, both the NMOS and PMOS polysilicon gates can receive N-type dopants, with mask 140 blocking the P-type implant from both the NMOS and PMOS polysilicon gates such that the gates are all doped to an N-type conductivity.

Figure 14:
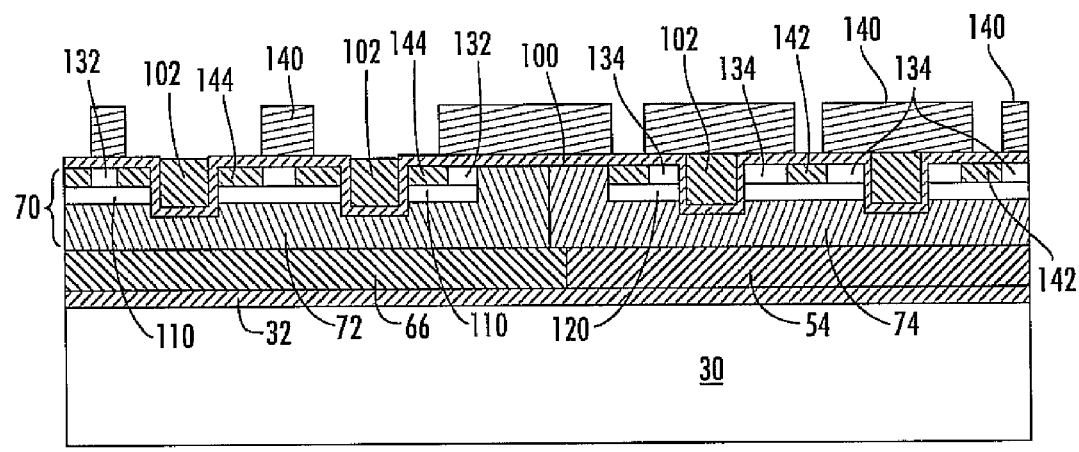
Figure 15:
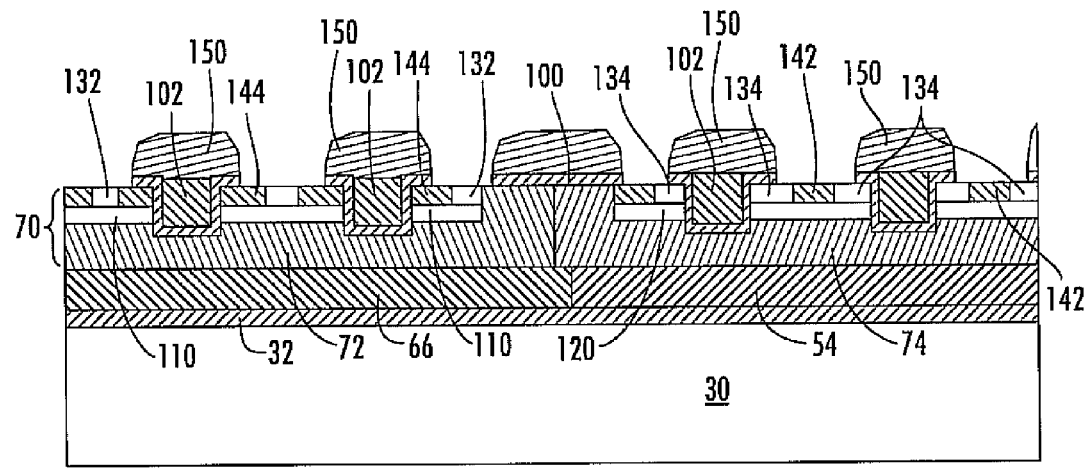

The N+ mask is removed and a P+ mask 140 is formed similar to that depicted in FIG. 14. The P+ mask will be used to define NMOS body contacts 142 (i.e. contacts to the P-type body 120 of the NMOS device), a PMOS source 144, and PMOS doping into the polysilicon regions 102 on the PMOS side of the structure, while the polysilicon on the NMOS side of the structure is protected from the P-type implant by the mask 140. The P+ implant can be performed using boron or $BF_2$ to a dose of between about 1E15 to about 1E16 ions/cm$^2$, for example a dose of about 2E15, and an implant energy of between about 5 KeV to about 80 KeV with 0° tilt to result in the FIG. 14 structure. Other implant schemes are also contemplated.

The P+ mask 140 is removed and a blanket oxide deposition is performed, for example using undoped oxide or borophosilicate glass (BPSG). An oxide reflow such as a BPSG reflow can be performed to generally planarize the surface of the assembly. A contact mask is formed over the oxide, then an etch is performed to remove the exposed oxide and the exposed gate oxide, with the etch stopping on the epitaxial layer 70 to form dielectric structures 150. An oxide reflow such as a rapid thermal anneal (RTA) is performed and the mask is removed to result in a structure similar to that of FIG. 15.

Figure 16:
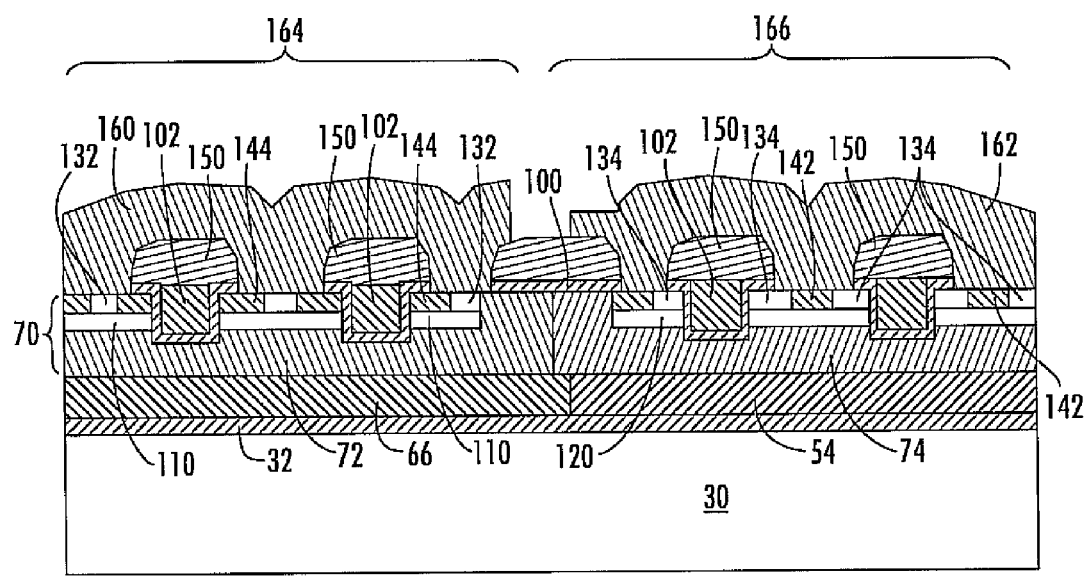

A blanket metal is formed, masked, and etched to form the NMOS and PMOS sources, as well as the gate connections to the respective device. This can result in a structure similar to FIG. 16, depicting PMOS source metal 160 which electrically contacts the PMOS source 110 (i.e. N-body) through N+ contacts 132, and NMOS source metal 162 which electrically contacts the NMOS source 120 (i.e. P-body) through contacts 142. Note that the gate metallization is not depicted in FIG. 16. The gates can be connected at the periphery of the active region, for example in accordance with known techniques. FIG. 16 depicts a high side vertical trench gate PMOS device 164 and a low side vertical trench gate NMOS device 166 for the low side.

The die of FIG. 16 provides a first portion 160 and a second portion 162 of a single metal layer, with the first portion 160 supplying a connection to the source 110 of the PMOS transistor 164 and the second portion 162 supplying a connection to the source 120 of the NMOS transistor 166. The die further includes a conductive structure 32, for example a buried metal layer such as tungsten and/or tungsten silicide which connects the drains of the PMOS transistor and the NMOS transistor such that the two devices have a common drain. That is, the drains of the two devices are formed within the epitaxial layer, which is connected by the conductive layer 32 to electrically short the two drains together. Because the two drains are shorted together, they form a common drain which is electrically the same node. The drains of both devices can therefore be accessed from a single contact elsewhere on the die, such as the backside of the wafer, which can provide packaging advantages.

The source of the PMOS high side device receives voltage in ($V_{IN}$), for example through metal 160. The source of the NMOS low side device is the ground, and can be connected through metal 162. The back of the die supplies the voltage out to the inductor (i.e. the output of the output stage). That is, as referenced in the FIGS., the back side of the die is the switched node of the output stage. Polysilicon 102 provides trench gates for the transistors, and can be connected at the periphery of the active region. The metal sources of the PMOS and NMOS transistors can provide a shielding for the trench gates and, therefore, provide shielded-gate transistors for both the high side PMOS transistor and the low side NMOS transistor.

Figure 17:
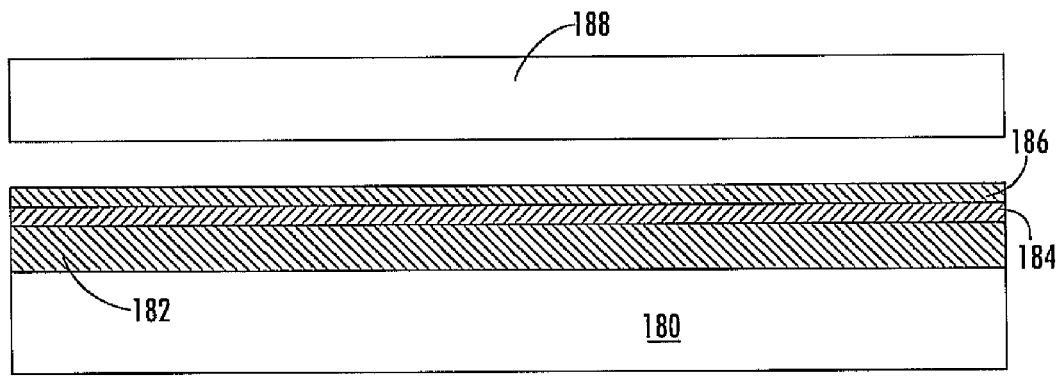
FIGS. 17 and 18 are cross sections of intermediate structures which can be formed in accordance with another embodiment of the present teachings using method variations to the previous embodiment.
Figure 18:
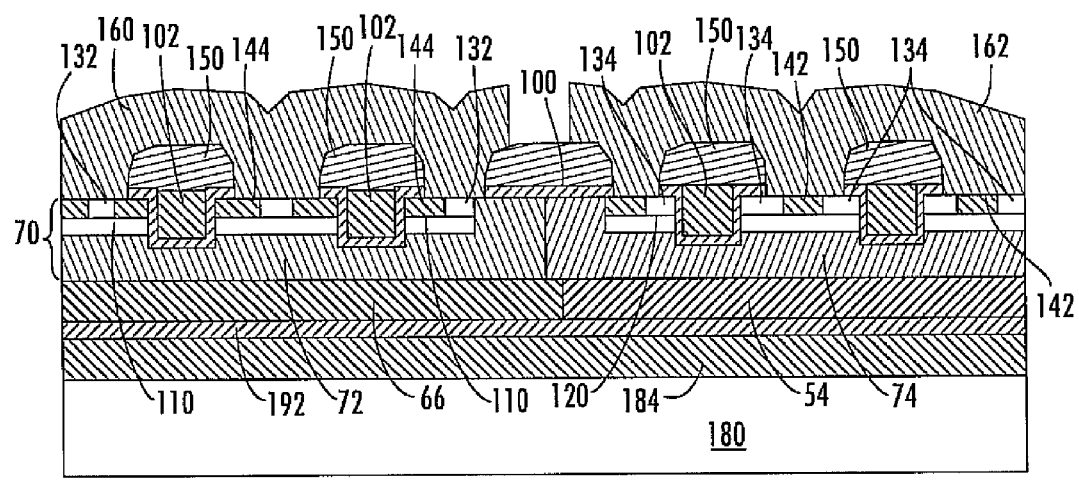

Another device is depicted in FIGS. 17 and 18. As depicted in FIG. 17, the substrate 180 is heavily doped to an N+++ conductivity with red phosphorus or arsenic, for example to a concentration of between about 1 E19 atoms/cm$^3$ and about 9E19 atoms/cm$^3$. An epitaxial layer 182 doped with a slower diffuser than the substrate, for example arsenic or antimony having a concentration in the range of between about 1E17 atoms/cm$^3$ to about 5E18 atoms/cm$^3$ and a thickness of between about 1 µm and about 6 µm, for example, is grown over the top surface of the substrate 180 to act as a "buffer" region to absorb any up-diffusion from the highly doped substrate. This provides a device buffer layer below a subsequently formed conductive layer 184. The conductive layer 184, which can include W or $WSi_x$, can be formed on or over substrate to a thickness of between about 0.1 µm to about 1.0 µm as depicted in FIG. 17. A material such as polysilicon 186 is deposited on or over the conductive layer 184 to a thickness of between about 0.1 µm and about 4.0 µm. The polysilicon is planarized, for example using CMP. A device wafer 188 is attached to the polysilicon 186, then the process can continue according to the process of FIGS. 3-16 to result in a structure similar to that depicted in FIG. 18. A device in accordance with FIG. 18 may have a lower substrate resistance resulting from a higher dopant concentration, for example from the use of high concentration red phosphorous rather than other dopants.

Figure 19:
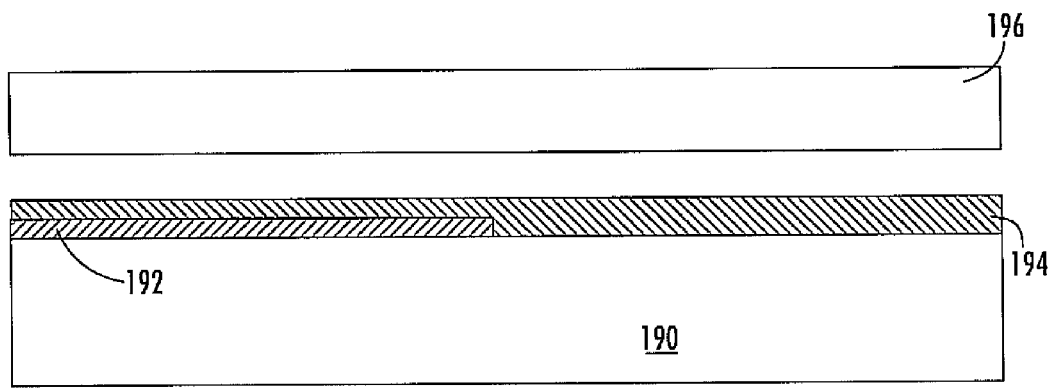
FIGS. 19 and 20 are cross sections of intermediate structures which can be formed in accordance with another embodiment of the present teachings using method variations to the previous embodiments.
Figure 20:
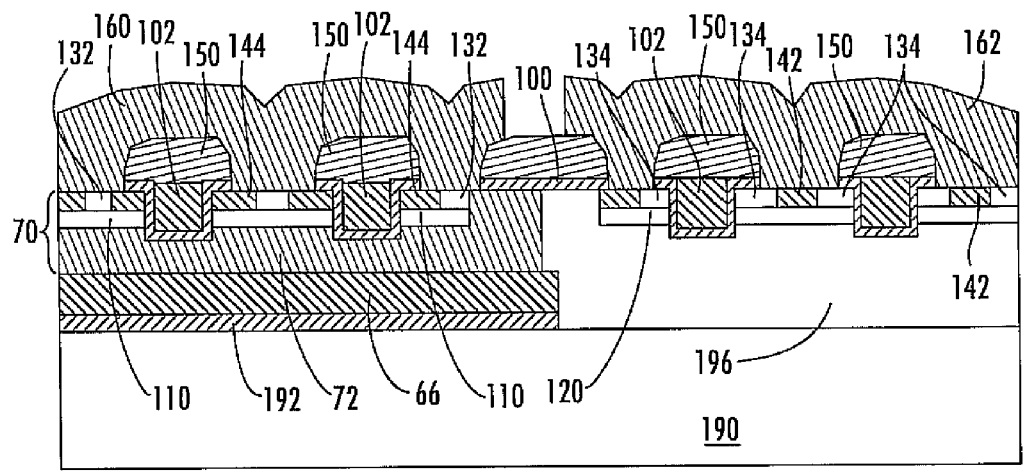

Another device is depicted in FIGS. 19 and 20. As depicted in FIG. 19, the substrate 190 is heavily doped to an N+++ conductivity with red phosphorus or arsenic, for example to a concentration of between about 1E19 atoms/cm$^3$ and about 9E19 atoms/cm$^3$. A patterned conductive layer which can include W or $WSi_x$ can be formed on or over substrate to a thickness of between about 0.1 µm to about 1.0 µm, then masked and etched so that it remains only in the PMOS regions, to result in the conductive layer 192 as depicted in FIG. 19. A material such as polysilicon 194 is deposited on or over the conductive layer to a thickness of between about 0.1 µm and about 4.0 µm. The thickness can be much larger than the W or $WSi_x$ thickness to allow for global planarization in addition to local planarization over the wafer surface. The polysilicon 194 is planarized, for example using chemical mechanical polishing (CMP), a device wafer 196 is attached to the polysilicon 194, then the process can continue according to the process of FIGS. 3-16 to result in the FIG. 20 structure.

In this embodiment, the drains of the PMOS and NMOS devices are connected together through the N+++ substrate. The drain of the PMOS device is connected to the substrate through P-type doping which electrically contacts metal 192, with metal 192 contacting the substrate 190.

A design trade off in the implementation of this method may arise from the fast diffusion of dopants through a tungsten silicide layer. For example, if the concentration of the P buried layer 66 is higher than that of the N substrate 190 at their respective sides of the silicide 192, the P buried layer will tend to diffuse through the silicide to form a net P region adjacent the bottom of the silicide thus PN junction isolating the PMOS drain from the substrate. If the P buried layer doping is lower than the N substrate doping, the N+ dopant that up diffuses through the silicide will tend to form a net N region adjacent the top of the silicide that PN junction isolates the PMOS drain from the silicide and thus from the N substrate. Each of these instances may defeat the intended common drain connection of the two devices. A similar situation may also occur in one or more earlier implementations. If so, the only drain to drain connection will be laterally through the silicide layer.

Buried metal 192, in effect, electrically shorts the P+ drain 72 over the buried metal to the underlying N+ substrate 190, while the drain of the NMOS device is connected to the substrate 190 through common N-type doping. In this embodiment, the NMOS device does not include buried metal in the drain region which results in a thicker epitaxial silicon layer. This, in turn, can result in an NMOS device having a higher breakdown voltage, resulting from the thicker epitaxial layer in the drain region.

Figure 21:
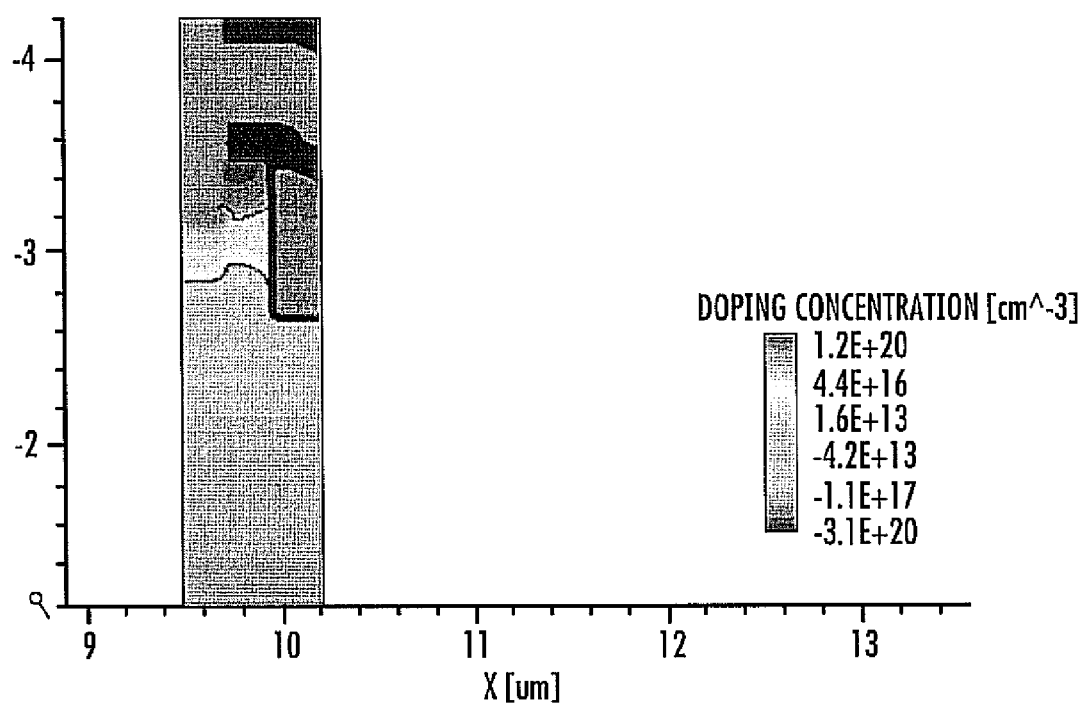
FIG. 21 is a technology computer aided design (TCAD) simulation of a device which can be formed in accordance with the present teachings.

Technology computer aided design (TCAD) simulations using 2D process and device simulation software can confirm the performance of a PMOS transistor fabricated using a process flow compatible with an NMOS transistor fabricated at the same time on the same wafer. A TCAD simulation is depicted in FIG. 21. An $RDS_{ON}$ at $V_{GS}$=12V of 20 milli-Ohm (m$\Omega$)*mm$^2$, obtained with a $BV_{DSS}$ of 26V, which is an excellent figure of merit for a P-channel device.

Thus the various structures and methods of the present teachings can provide a low cost solution with a minimized number of masks. The structure provided reduces costs, for example because it can be formed in an area which is smaller than two discrete dies. The device provided has is high efficiency and can operate at high frequency through elimination of parasitic inductance between the drain of the high side PMOS transistor and the drain of the low side NMOS transistor. This approach enables the use of vertical MOSFET structures for both the high side and low side devices, which can minimize the specific resistance ($RDS_{ON}$*area), while providing independent threshold control. Without being bound by theory, it is believed that an embodiment of the present teachings can provide a PMOS with lower specific resistance because the devices are vertical and the cell pitch can be smaller than is possible using lateral PMOS (compared to monolithically integrated NMOS and PMOS using prior approaches such as standard Integrated Circuit technologies). Cell pitch is decreased, for example, from the use of only two electrodes on the top surface (source and gate) while lateral devices require the use of three electrodes (source, gate, and drain) on the top surface. The resulting output stage device (or PowerDie) as described can be co-packaged with a controller IC, or may be used as a separate power stage. The use of PMOS simplifies the design of the controller integrated circuit since the $V_{GS}$ of a P-channel device is with respect to the $V_{IN}$, which is one of the supply rails.

It will be understood that another embodiment of the present teachings includes switching N junctions with P junctions, and P junctions with N junctions.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

The invention claimed is:
1. A semiconductor device, comprising:
   a semiconductor die comprising a single semiconductor substrate;
   a vertical p-channel metal oxide semiconductor (PMOS) transistor overlying the single semiconductor substrate, wherein the vertical PMOS transistor comprises an active area;
   a vertical n-channel metal oxide semiconductor (NMOS) transistor overlying the single semiconductor substrate, wherein the vertical NMOS transistor comprises an active area;
   a drain of the vertical PMOS transistor electrically connected to the substrate at a location including underlying the vertical PMOS transistor active area;
   a drain of the vertical NMOS transistor electrically connected to the substrate at a location including underlying the vertical NMOS transistor active area; and
   a conductive layer which connects the drain of the vertical PMOS transistor to the drain of the vertical NMOS transistor such that the PMOS transistor and the NMOS transistor have a common drain.

2. The semiconductor device of claim 1, further comprising:
   the vertical PMOS transistor is a high side power device for a semiconductor device voltage converter output stage; and the vertical NMOS transistor is a low side power device for a semiconductor device voltage converter output stage.

3. The semiconductor device of claim 1, wherein the vertical PMOS is coupled to an input voltage via a first metal layer connection overlying the vertical PMOS and the vertical NMOS is coupled to ground via a second metal layer connection overlaying the vertical NMOS.

4. The semiconductor device of claim 3, wherein the first metal layer connection and the second metal layer connection are formed as a single metal layer.

5. The semiconductor device of claim 1, wherein at least one of the vertical PMOS and the vertical NMOS comprise one or more double-diffused metal oxide semiconductor (DMOS) devices.

6. The semiconductor device of claim 1, wherein at least one of the vertical PMOS and the vertical NMOS comprise a vertical trench gate structure.

7. The semiconductor device of claim 1, wherein the conductive layer is a buried metal layer coupled to the drain of the vertical PMOS transistor and to the drain of the vertical NMOS transistor.

8. The semiconductor device of claim 1, wherein the single semiconductor substrate is an output node of the vertical NMOS transistor and the vertical PMOS transistor.

9. The semiconductor device of claim 1, wherein the single semiconductor substrate has an N-type conductivity.

10. The semiconductor device of claim 9, wherein the drain of the vertical NMOS transistor is electrically connected to the substrate via common N-type doping; and
wherein the conductive layer connects the drain of the vertical PMOS transistor to the substrate such that the drain of the vertical NMOS transistor and the drain of the vertical PMOS transistor are electrically connected through the substrate.

11. A semiconductor device voltage converter comprising:
a single semiconductor die, comprising:
a vertical p-channel metal oxide semiconductor (PMOS) transistor, wherein a source of the vertical PMOS transistor is adapted to be electrically coupled with voltage in ($V_{IN}$); and
a vertical n-channel metal oxide semiconductor (NMOS) transistor, wherein a source of the vertical NMOS transistor is adapted to be electrically coupled with ground,
wherein a drain of the vertical PMOS transistor is electrically shorted to a drain of the vertical NMOS transistor.

12. The semiconductor device of claim 11, further comprising:
the single semiconductor die, further comprising:
a semiconductor substrate having an N-type conductivity;
the drain of the vertical PMOS transistor is a P-type conductivity; and
a conductive layer which electrically shorts the drain of the vertical PMOS transistor to the drain of the vertical NMOS transistor through the semiconductor substrate at a location including underlying an active area of the vertical PMOS transistor.

13. The semiconductor device voltage converter of claim 11, wherein the single semiconductor die further comprises:
a first semiconductor layer which supplies an output of the semiconductor device voltage converter;
a second semiconductor layer overlying the first semiconductor layer, wherein the vertical PMOS transistor drain and the vertical NMOS transistor drain are both at least partially located within the second semiconductor layer; and
a buried metal layer interposed between the first semiconductor layer and the second semiconductor layer which electrically shorts the drain of the vertical PMOS transistor to the drain of the vertical NMOS transistor.

14. The semiconductor device voltage converter of claim 13, wherein the vertical PMOS transistor source and the vertical NMOS transistor source are formed from the same metal structure.

15. The semiconductor device voltage converter of claim 11, wherein the vertical PMOS transistor and the vertical NMOS transistor are both double-diffused metal oxide semiconductor (DMOS) devices.

16. The semiconductor device voltage converter of claim 11, further comprising:
a trench gate for the vertical PMOS transistor; and
a trench gate for the vertical NMOS transistor.

17. The semiconductor device voltage converter of claim 11, further comprising:
a metal layer, comprising:
a first portion which is electrically connected to the source of the vertical PMOS transistor, wherein the first portion of the metal layer overlies a gate of the vertical PMOS transistor to provide shielding for the gate of the vertical PMOS transistor; and
a second portion which is electrically connected to the source of the vertical NMOS transistor, wherein the second portion of the metal layer overlies a gate of the vertical NMOS transistor to provide shielding for the gate of the vertical NMOS transistor.

18. The semiconductor device voltage converter of claim 13, further comprising an epitaxial layer interposed between the buried metal layer and the first semiconductor layer.

19. A method for forming a semiconductor device voltage converter, comprising:
etching a plurality of trenches into a semiconductor layer; and
forming a conductive transistor gate for a high side vertical p-channel metal oxide semiconductor (PMOS) transistor within one of the plurality of trenches and a conductive transistor gate for a low side vertical n-channel metal oxide semiconductor (NMOS) transistor within another one of the plurality of trenches.

20. The method of claim 19, further comprising:
forming a first portion of a metal layer over the conductive high side vertical PMOS transistor gate and contacting a source of the vertical PMOS transistor;
forming a second portion of the metal layer over the conductive low side vertical NMOS transistor gate and contacting a source of the vertical NMOS transistor, the second portion electrically connected with the first portion of the metal layer; and
etching the metal layer to electrically isolate the first portion of the metal layer from the second portion of the metal layer;
wherein the first portion of the metal layer is a source of the conductive high side vertical PMOS transistor and the second portion of the metal layer is a source of the conductive low side vertical NMOS transistor.

21. The method of claim 20, further comprising:
electrically connecting the first portion of the metal layer with a voltage in ($V_{IN}$) signal; and
electrically connecting the second portion of the metal layer with a ground signal.

22. The method of claim 21, further comprising:
forming a conductive structure electrically connected with both a drain of the vertical PMOS transistor and a drain of the NMOS transistor, which electrically shorts the drain of the vertical PMOS transistor with a drain of the NMOS transistor during operation of the semiconductor device voltage converter.

23. The method of claim 20, further comprising:
forming a conductive layer over a semiconductor wafer;
attaching the semiconductor layer to the semiconductor wafer, such that the conductive layer is interposed between the semiconductor wafer and the semiconductor layer;
forming a drain for the high side vertical PMOS transistor within the semiconductor layer; and
forming a drain for the low side vertical NMOS transistor within the semiconductor layer,
wherein the conductive layer electrically shorts the drain of the high side vertical PMOS transistor to the drain of the low side vertical NMOS transistor.

24. The method of claim 19, wherein etching the plurality of trenches into the semiconductor layer comprises simultaneously etching the plurality of trenches into the semiconductor layer.

\* \* \* \* \*